United States Patent
Daly et al.

[11] Patent Number: 5,955,703
[45] Date of Patent: Sep. 21, 1999

[54] CIRCUITIZED ELECTRICAL CABLE AND METHOD OF ASSEMBLING SAME

[75] Inventors: John J. Daly, Chicago; Oleg Los, Glenview, both of Ill.

[73] Assignee: Methode Electronics, Inc., Chicago, Ill.

[21] Appl. No.: 08/687,144

[22] Filed: Jul. 24, 1996

Related U.S. Application Data

[63] Continuation-in-part of application No. 08/608,553, Feb. 28, 1996.

[51] Int. Cl.$^6$ .................................................. H01R 23/70
[52] U.S. Cl. ........................................ 174/117 R; 439/629
[58] Field of Search .................. 174/117 R, 117 F, 174/117 FF; 439/67, 76.1, 946, 633, 629

[56] References Cited

U.S. PATENT DOCUMENTS

| | | | |
|---|---|---|---|
| 4,682,828 | 7/1987 | Piper et al. | 439/92 |
| 5,097,100 | 3/1992 | Jackson | 174/94 R |
| 5,108,294 | 4/1992 | Marsh et al. | 439/76 |
| 5,219,292 | 6/1993 | Dickirson et al. | 439/67 |
| 5,509,823 | 4/1996 | Harting et al. | 439/607 |
| 5,688,146 | 11/1997 | McGinley et al. | 439/637 |

OTHER PUBLICATIONS ser. No. 08/674,777 Daly et al.
U.S. application No. 08/515,813, Poplawski et al.

Primary Examiner—Kristine L. Kincaid
Assistant Examiner—Marc D. Machtinger
Attorney, Agent, or Firm—David L. Newman; Jeffrey H. Canfield

[57] ABSTRACT

A circuitized electrical cable having a flat cable having a stripped portion exposing conductors of the cable and having a circuit board mounted to the stripped portion wherein the conductive fingers at a first edge of the circuit board are soldered directly to the correspondingly oriented conductors of the cable. The circuit board may include componentry in order to provide for altered signal transmission of the signal lines of the cable such as for signal line termination. The circuit board may include a second edge having a beam having conductive fingers adhered thereto and the circuit board may be inserted within a housing having a shroud protruding therefrom surrounding the beam in order to provide for a male I/O connector electrically connected to conductors of the electrical cable.

20 Claims, 3 Drawing Sheets

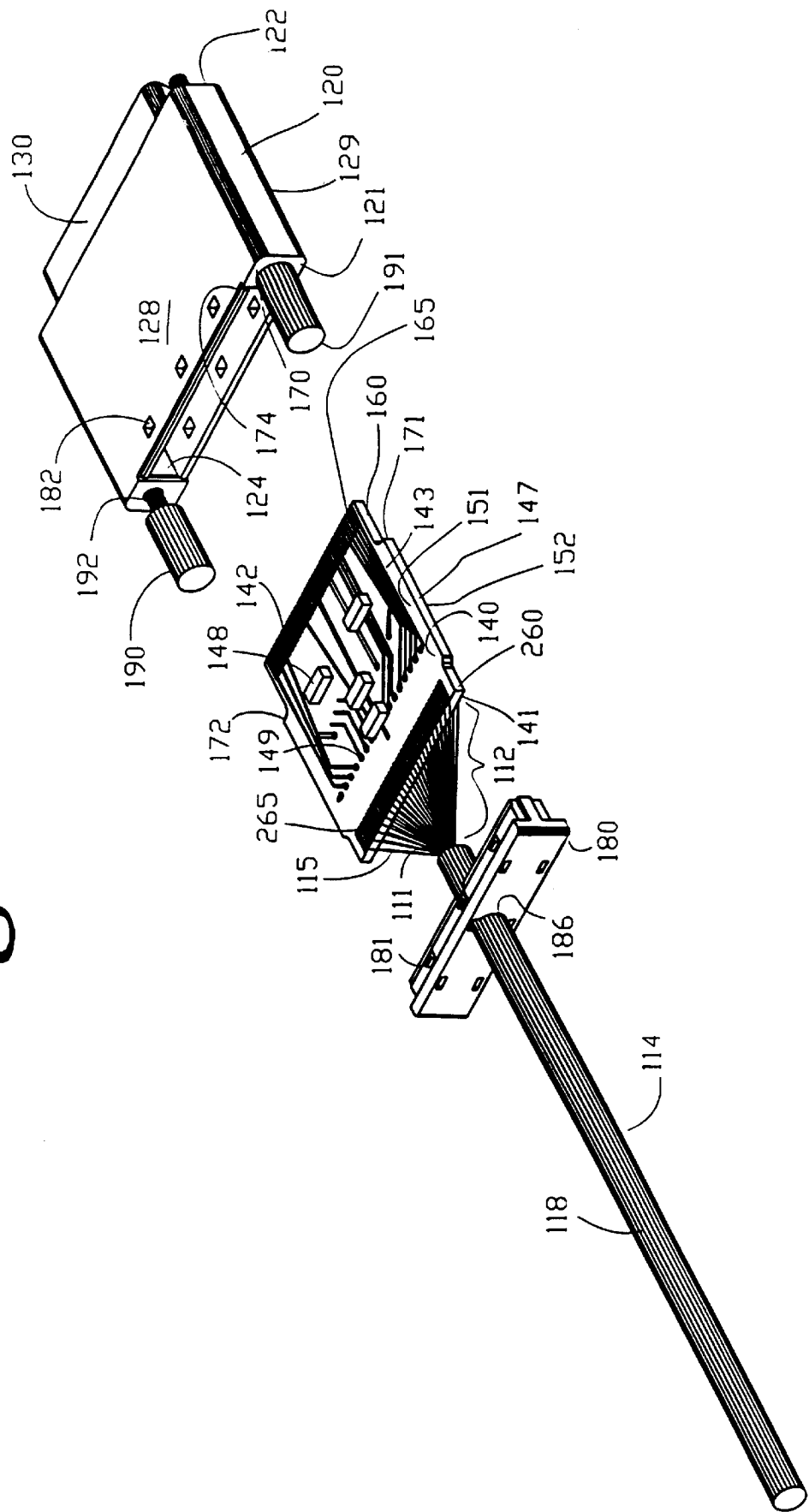

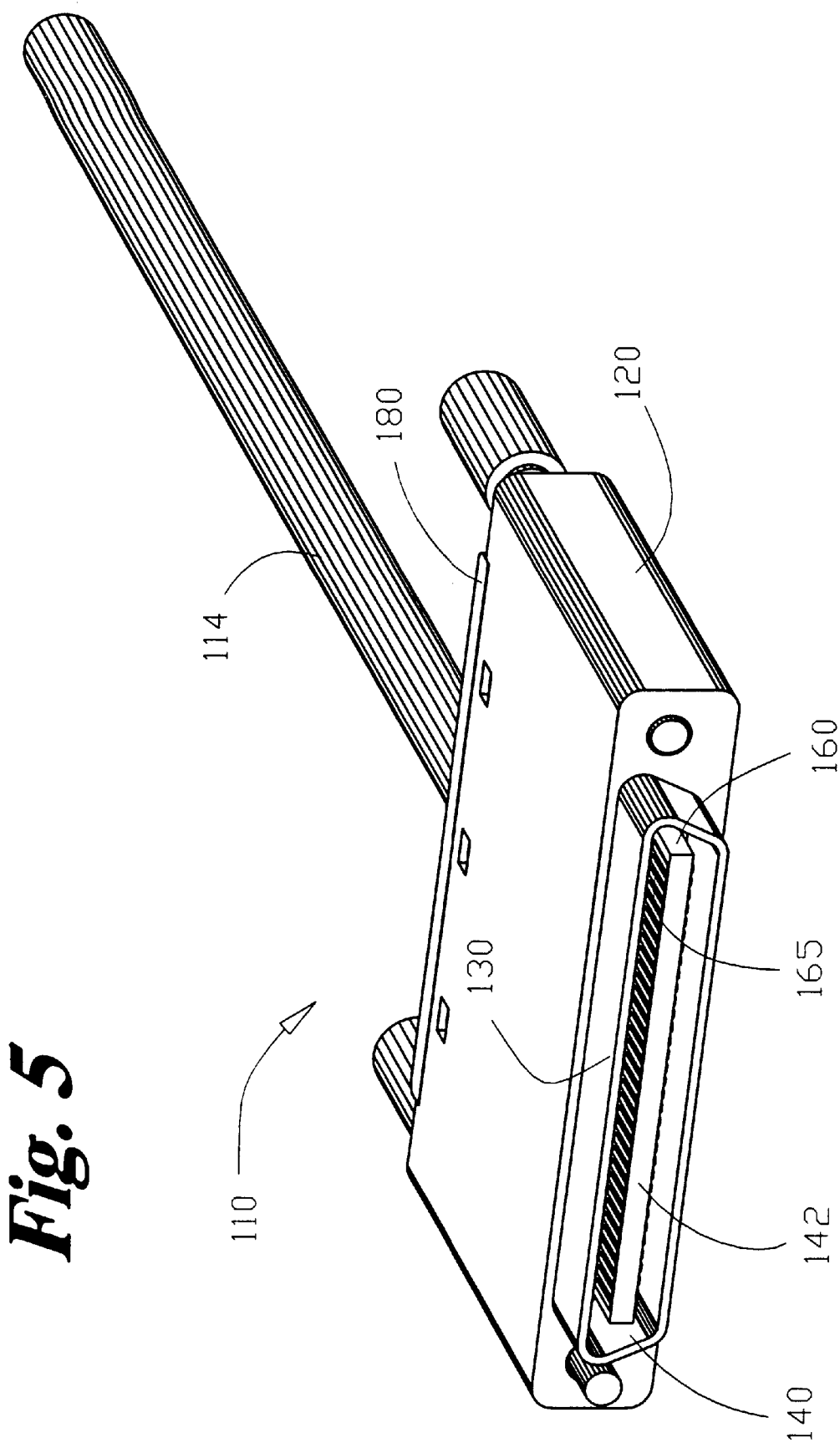

CIRCUITIZED ELECTRICAL CABLE AND METHOD OF ASSEMBLING SAME

This is a continuation-in-part application of U.S. Ser. No. 08/608,553, filed Feb. 28, 1996.

BACKGROUND OF THE INVENTION

The present invention pertains to an electrical cable and, in particular, a circuitized electrical cable and a method for assembling a circuitized electrical cable.

Electrical cables such as flat ribbon cables are typically connected at each end to a component. The cable may be stripped at each end and the bare conductors attached directly to the component or an electrical connector may be mounted to the end of the cable and the connector plugged into a component. As the cables have also been used in more and more complex systems, additional devices have been added intermediate the ends of the cable. In the most common form, insulation displacement contact (DC) connectors are added to the cable at any point by having IDC contacts with sharp edges pierce the insulation of the cable and make electrical contact with the conductors of the cable. The IDC connectors generally have exposed female contacts for attachment of another device to the IDC connector. For example, U.S. Pat. No. 5,472,348 discloses the attachment of a terminator to an IDC connector mounted to flat ribbon cable. The terminator includes a housing having a printed circuit board mounted therein having circuitry and components mounted thereon to provide for the termination circuitry. Also mounted through the printed circuit board are contacts which mate with the female IDC connector mounted on the flat ribbon cable. In this way, the signal lines of the flat ribbon cable may each be individually altered according to the circuitry of the connector which is attached to the IDC connector mounted on the cable. However, the aforementioned system has the disadvantages in that multiple components must be manufactured and attached to the electrical cable requiring multiple steps and lengthy assembly time.

Further, data rates of cables continue to increase. For example, the promulgation of SCSI I, then SCSI II, then SCSI III has caused increase in density and speeds on cables and connectors. Such increases make the impedance levels of these systems more important. Generally, the greater the number of interconnects in an assembly, the greater the impedance and the slower the data rate. Therefore, it is desired for there to be a new, improved low impedance cable assembly.

Therefore, it is an object of the present invention to provide an electrical cable which may be circuitized quickly and inexpensively.

It is another object of the present invention to provide a circuitized electrical cable having an extremely low profile.

It is a further object of the present invention to provide for a method of circuitizing an electrical cable by mounting a circuit board directly thereto.

It is another object of the present invention to provide a cable assembly having controlled impedance mismatch.

SUMMARY OF THE INVENTION

A principal object of this invention is to provide a circuitized electrical cable comprising a flat cable including a stripped portion exposing a plurality of conductors and a circuit board having a first end with a plurality of conductive fingers oriented correspondingly to the conductors and the first end mounted to the flat cable at the stripped portion wherein the plurality of conductors form a one-to-one electrical connection with the plurality of conductive fingers. The circuit board may include a resistor network to provide for the termination of the signal lines of the flat cable. The conductive fingers may be oriented along a first edge of the circuit and each conductive finger is soldered to a correspondingly extended conductor of the flat cable. The circuit board may include a second edge having an electrical connector attached thereto. The circuit board may include a second edge having contacts protruding therefrom. The circuit board may include a second edge having a ribbon-style connector attached thereto. The first end of the cable and the circuit board may have an overmolded housing attached thereto.

In an embodiment, a terminated cable comprises a flat cable including a stripped portion exposing a plurality of conductors and a circuit board having a first end with a plurality of conductive fingers oriented correspondingly to the conductors and having mounted thereon a resistor network to provide for signal line termination and the first end mounted to the flat cable at the stripped portion wherein the plurality of conductors form a one-to-one electrical connection with the plurality of conductive fingers in order to terminate the flat cable.

A method of assembling a circuitized electrical connector is provided including the steps of stripping a flat cable at a first end to form a stripped portion having an exposed plurality of conductors, mounting a first edge of a circuit board having a plurality of conductive fingers thereon at the stripped portion of the flat cable and soldering the plurality of conductive fingers to the plurality of conductors of the flat cable. The method wherein the cable is stripped via a rotary grinding machine. The method wherein the conductive fingers include solder pads and the circuit board is placed onto the cable so that the conductive fingers are aligned with the conductors of the cable and the assembly is exposed to heat in order to reflow the solder pads and connect the conductive fingers to the conductors of the cable. The method wherein the circuit board has a connector attached to a second edge. The method wherein the first end of the cable and the circuit board having a housing overmolded thereof. The method including the step of removing an extraneous portion of the flat cable after the conductive fingers have been soldered to the conductors. The method including the step of placing the circuit board having been mounted to the stripped portion of the cable in a vapor phase oven in order to reflow solder pads on the conductive fingers.

In an alternate embodiment, an electrical cable assembly is provided comprising a cable including a stripped portion exposing a plurality of conductors and a circuit board having a first end with a plurality of conductive fingers oriented correspondingly to the conductors and the first end mounted to the flat cable at the stripped portion wherein the plurality of conductors form a one-to-one electrical connection with the plurality of conductive fingers and the circuit board includes a second end having a plurality of conductive fingers oriented along the length of the second end. The printed circuit board may include a beam protruding at the second end and having the conductive fingers adhered thereto wherein the circuit board is mounted within a housing and the beam of the circuit board protrudes from an end of the housing and is surrounded by a shroud in order to provide a male I/O connector. The circuit board may include a first side and a second side and the conductive fingers are adhered along the beam on the first side and the second side of the circuit board. The conductive fingers may be spaced on 0.8 mm spacing. The shroud may be a D-shaped shroud. The printed circuit board may have a collar mounted around the beam at the second edge of the circuit board. The collar may electrically insulate the printed circuit board. The housing may have a metallized coating to provide for EMI/RFI shielding. The electrical cable may have shielding which is attached to the shielding of the housing. The circuit board may include termination circuitry thereon connected to the conductive fingers wherein the assembled cable comprises a terminator assembly.

These and other features of the invention are set forth below in the following detailed description of the presently preferred embodiments.

BRIEF DESCRIPTION OF THE DRAWINGS

FIG. 4 is an exploded view of an alternate embodiment of an electrical cable assembly of the present invention; and FIG. 5 is a perspective view of the assembled cable assembly of FIG. 4.

DETAILED DESCRIPTION OF THE PRESENTLY PREFERRED EMBODIMENTS

Figure 1:
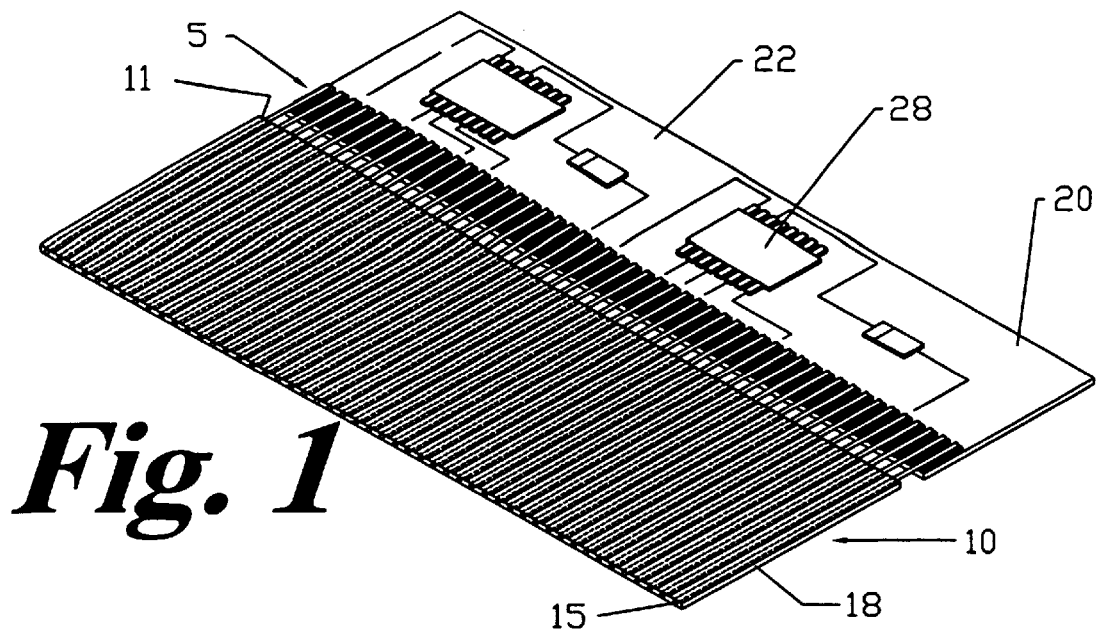
FIG. 1 is a perspective view of the circuitized electrical cable of the present invention.
Figure 2:
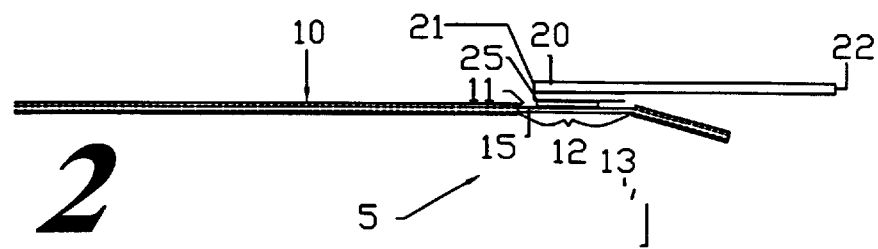
FIG. 2 is a side-elevational view of the circuitized electrical cable of the present invention prior to complete assembly.
Figure 3:
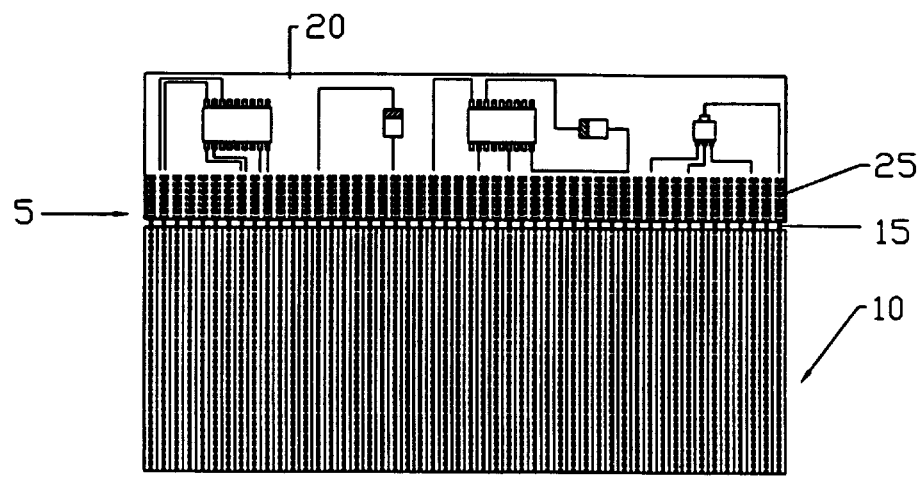
FIG. 3 is a plan view of the circuitized electrical cable of the present invention.

The present invention is best understood with reference to FIGS. 1–3. FIG. 1 is a perspective view of the circuitized electrical cable assembly 5 of the present invention showing a flat cable 10 having a plurality of conductors 15 surrounded by insulation 18. In a preferred embodiment, the flat cable 10 is a flat ribbon cable having fifty conductors. The cable 10 includes a first end 11 which is stripped in order to expose the conductors 15. The cable may be stripped by any conventional method such as by placing the cable between rollers of a rotary grinding machine and scraping the insulation off along a portion of the cable. In a preferred embodiment a Eraser Company, Inc. (Syracuse, N.Y.) rotary grinding machine, Model No. D 109 No. AR1001 is used which removes the insulation from between and around the conductors without damaging the conductors. The cable may be stripped also by chemical agents. The stripped portion 12 (see FIG. 2) may have a width of approximately a quarter of an inch. After stripping, the exposed conductors of the cable may be cleaned with a solvent such as isopropyl alcohol. FIG. 1 shows the assembled circuitized electrical cable of the present invention in its fully assembled state shown in an inverted position with the conductors 15 of the cable 10 exposed and attached to the circuit board 20 and the extraneous portion of the cable 10 removed. However, during the assembly of the circuit board 20 to the electrical cable 10, the assembly is inverted from that shown in FIG. 1 and is assembled in the orientation as shown in FIG. 2.

The assembly procedure beings by placing the cable 10 having the conductors 15 exposed at the first end 11 onto a tray. The circuit board 20 includes a plurality of conductive fingers 25 along the first edge 21 (see FIG. 2) of the circuit board 20. The conductive fingers 25 are oriented correspondingly to the plurality of conductors 15 of the cable 10. The circuit board 20 is placed over the cable 10 so that each of the conductive fingers 25 is aligned with the corresponding conductors 15 of the cable 10. The tray to which the cable 10 is placed includes edges which align the cable 10 and also help to align the circuit board 20 so that it is placed properly on the cable 10 so that the conductive fingers 25 are aligned with the conductors 15 of the cable 10. The conductive fingers 25, in a preferred embodiment, include solder pads 26. In a preferred embodiment, the tray which holds the electrical cable and the circuit board placed thereon is then placed in a vapor phase oven in order to reflow the solder pads 26 of the conductive fingers 25 and provide for an electrical connection between the conductive fingers 25 and the conductors 15. The cable 10 and printed circuit board 20 assembly is then cured. Other means of attaching the circuit board 20 to the cable 10 may be used such as hot bar or any other convection method.

After soldering of the circuitized cable assembly 5, the cable 10 is trimmed to remove the extraneous portion 13. The extraneous portion 13 of the cable 10 is retained with the assembly 5 during the attachment process in order to maintain the conductors 15 of the cable 10 in a rigid spaced orientation so that the conductors 15 align with the corresponding conductive fingers 25 of the circuit board 20. After the conductors 15 are attached to the conductive fingers 25 of the circuit board 20, the extended extraneous portion 13 of the cable may be removed. Following removal of the extraneous portion 13 of the cable 10, the circuitized cable assembly 5 is then in its final assembled condition as shown in FIG. 1. In an embodiment, the assembly 5 having termination circuitry on the circuit board 20 provides for termination of a bus and the assembly 5 is the last component on the cable 10. In such an embodiment of the invention, the circuit board 20 may include circuitry including a resistor package 28 which may provide for the termination of all of the signal lines in accordance with the small computer system interface (SCSI) protocol. In such an assembly, the second end (not shown) of the electrical cable 10 may be attached to another area of the computer such as a peripheral port or connector and the first end 11 is attached to the circuit board 20 which terminates all of the signal lines so that all of the signals of the cable 10 have been terminated by causing the bus signal lines to be asserted at predetermined levels. In such an embodiment, the assembly 5 may be protected by a cover such as by mechanically placing a housing over the end 11 of the cable or encapsulating the assembly 5 via insert molding, potting and curing or fluidized bed and curing.

In another embodiment, the second edge 22 of the circuit board may have plated fingers thereon or may have contacts protruding therefrom in order to attach the assembly 5 to a component. For example, the circuit board may be attached directly to the back end of a hard disk drive of a computer. In another embodiment, the circuit board 20 at its second end 22 may have an electrical connector attached thereto such as an electrical connector having fifty pins. Or the edge of the circuit board 20 may protrude and have conductive fingers placed thereon in order to form a connector such as a ribbon-style electrical connector or a pluggable connector. Such an assembly could then be overmolded so that a plastic housing surrounds the first end 11 of the cable 10 and the entire circuit board 20. In this way, the circuitized electrical cable assembly 50 may be easily stored and transported for later use and connection to an apparatus.

Depending on the function required of the circuits attached to the assembly 5, the components which are placed on the circuit board 20 can be arranged in such a way in order to provide an extremely low profile. In other words, the circuit board 20 generally has a height of $\frac{1}{16}$th of an inch which is approximately equal to the height of the flat cable 10. The components mounted onto the circuit board may add another 1/10 of an inch. Components may also be mounted on both sides of the circuit board 20. But overall, the entire assembly 5 has an extremely low profile and allows for the cable 10 to be inserted and arranged in many different orientations. In the embodiment where the circuit board 20 is overmolded, the entire overmolded housing at the end of the cable may also have a small height or low profile so that it may be connected and inserted in a small space.

In a preferred embodiment, the circuit board 20 is formed of FR4 and the conductive fingers 25 are made of a plated silver metallic material which is subtractively placed on the circuit board 20. In an alternate embodiment, the circuit board 20 may be made of a moldable plastic material such as liquid crystal polymer and have the traces and conductive fingers 25 formed of a conductive coating which is additively adhered to the circuit board 20. In an embodiment, the circuit board provides for termination of the signal lines and includes thick-film polymer resistors screened onto the circuit board and conductively connected to conductive fingers 25. Turning to FIG. 3, a top view of the circuitized cable assembly of the present invention is shown having the circuit board 20 having conductive fingers 25 on the underside attached to conductors 15 of the cable 10.

Turning to FIG. 4, a perspective view of a cable assembly 10 is shown having a housing 120 formed in a preferred embodiment of the plastic material, such as ABS (Cycolac®, Resin EPB-3570, manufactured by GE Plastics, Lisle, Ill.) and having a metallized outer covering to provide EMI/RFI shielding. The housing 120 includes a first end 121 and a second end 122. The housing may be formed of an integrally molded piece as shown in FIG. 4 or may have a clamshell design consisting of two halves attached together via a press-fit. The metallized halves are joined in order to provide conductivity between the halves and D-shaped shroud clamped between the housing halves. Running between the first end and the second end 121, 122 is a cavity 124. Mounted at the second end 122 surrounding the opening of the cavity 124 is a shroud 130. The shroud 130 is D-shaped and may be formed of plastic and metallized or formed of metal. The shroud 130 surrounds the opening of the cavity 124 at the second end 122 of the housing 120. The cavity 124 includes an insertion track for receiving the protruding edge 147 of circuit board 140. In a preferred embodiment, the insertion track is only provided on one side of the cavity 124 so that the circuit board can only be inserted within the cavity 124 in a single orientation.

The circuit board 140 in a preferred embodiment is formed of FR4 which is a glass-filled epoxy and includes traces 143 adhered thereto. In a preferred embodiment, the circuit board 140 has a maximum variation in thickness of 0.001 inch. The traces 143 may be adhered via any traditional method, such as copper-cladding to the circuit board 140. Mounted on the circuit board are components 148 which provide for the electronics desired on the circuit board. In a preferred embodiment, the cable assembly may provide termination of a computer bus. In such an instance, the components 148 may be active components such as a voltage regulator or a capacitor or may be passive components such as a resistor or resistor network. The components 148 combined with the traces 143 make up terminator circuitry which provides for the termination of signals from a computer bus which are connected to the cable assembly 110 through the electrical cable 114. The termination circuitry may be included on both the first side 151 or the second side 152 of the circuit board 140. Vias 149 may be provided for carrying signals from the first side 151 to the second side 152 of the circuit 140 or vice-versa.

The circuit board 140 includes a first edge 142 and a second edge 141. The circuit board 140 while providing for a substrate for carrying circuitry also forms a male connector at the first edge 142. A beam portion 160 is formed at the second edge 142 of the circuit board and extends across the length of the circuit board 140. Extending along the length of the beam 160 on the first side 151 and the second side 152 are conductive fingers 165. In a preferred embodiment, thirty-four conductive fingers 165 are adhered on each side along the beam 160 on 0.8 mm spacings on each side 151, 152. In another embodiment, twenty-five fingers may be adhered on each side. In a preferred embodiment, the fingers 165 are copper traces with a gold protective layer. The traces 143 and fingers 165 in a preferred embodiment are formed of a copper laminate over the PCB. The fingers 165 are then plated with nickel and then a gold protective layer. The protective layer increases cycling performance and limits contact resistance and contamination. The gold protective layer in a preferred embodiment is highly conductive having 0.5 ohMs per square. The gold, in a preferred embodiment, is adhered via a screen printing process using a composition comprising a polymer or epoxy based conductive ink. The copper traces 143 may also be protected with plating such as tin, nickel, lead or gold plating using traditional methods such as electroless or electrolytic plating. In an alternate embodiment, the circuit board 140 may be formed of a polymer molded material and the traces 143 and the conductive fingers 165 may be adhered via an additive process using conductive ink. The conductive fingers 165 are connected to the traces 143 and provide for the termination of each signal line connected to the conductive fingers 165.

The circuit board 140 also includes at the second edge 141 a second beam 260 running parallel to the first beam 160 and also including conductive fingers 265. In a preferred embodiment, the conductive fingers 265 along the second beam 260 include sixty-eight conductive fingers 265 on 0.8 mm spacings. These conductive fingers 265 are formed simultaneously with the first conductive fingers 165 on the first beam 160 and are formed as discussed above for the conductive fingers 165 on the first beam 160.

The other pieces to be assembled to form the cable assembly comprise a collar 170, a cover 180 and thumb screws 190, 191. In order to assemble the cable assembly 110, a cover 180 is placed over the electrical cable 114. The cover 180 includes an aperture 186 through which the electrical cable 140 is inserted. The aperture 186 may include strain relief means in order to grasp the electrical cable and provide strain relief to the cable after the cover 181 is moved to its final position. In an alternate embodiment, the cover 181 may be molded as an integrally formed member with a housing half, so that when two halves are snapped together, the cover 181 encloses the cavity 124.

The electrical cable 114 is then terminated. The cable 114, in a preferred embodiment, is a round cable having multiple conductors therein. In an alternate embodiment, a flat ribbon cable may also be used. In a preferred embodiment, sixty-eight conductors are located within the round electrical cable 114. The electrical cable 114 may also have a layer of a metallic foil for RFI/EMI shielding. An insulative layer 118 is formed at the outer periphery of the electrical cable 114. The electrical cable 114 is stripped to expose the conductors 115. The cable may be stripped by any conventional method, such as by placing the cable between rollers of a rotary grinding machine or scraping insulation off along a portion of the cable 114. The stripped portion 112 may have a width of approximately one-quarter inch. After stripping, the exposed conductors 115 may be cleaned with a solvent such as isopropyl alcohol. The conductors 115 are oriented correspondingly to the conductive fingers 265 along the first and second side 151, 152 of the second beam 260. Prior to attachment of the conductors 115 to the printed circuit board 140, the conductors may be spread and fanned out and laminated in a flat orientation. The lamination of the conductors is carefully done so that the conductors are spaced in the preferred spacing corresponding to the spacing of the conductive fingers 265. In a preferred embodiment, the conductors 115 are spaced on 0.8 mm centers. The ends of the conductors are then aligned with the conductive fingers 265 and may be attached to the conductive fingers 265 according to any known method. For example, the conductors may be soldered to the conductive fingers 265. In an alternate embodiment, the conductive fingers may be sonic welded to the conductive fingers 265 of the printed circuit board 140.

After the conductors 115 are terminated on the printed circuit board 140, the cover 180 may be slid down toward the first end 111 of the electrical cable 114. The cover 180 is slid over the second beam 260 of the printed circuit board 140 and surrounds the conductive fingers 265 in order to protect the conductors 115 attached thereto. While the cover 180 is slid down at the first end 111 of the electrical cable 114, the shielding foil of the electrical cable 114 is also attached to the cover 180. The cover 180 includes a metallized outer covering to provide EMI/RFI shielding. The metal foil of the electrical cables attach to the outer metallized covering of the cover 180 in order to ground the electrical cable to the cover 180 and the housing 120.

The collar 170 is then placed over the second edge 142 of printed circuit board surrounding the first beam 160. The circuit board includes shoulders 171, 172 which the backside of the collar 170 abuts against upon insertion over the beam 160. The collar 170 provides for the centering of the beam within the shroud 130 upon insertion of the circuit board 140 within the housing 120. The collar 170 also isolates the conductive traces 149 from the metallized housing 120. Upon insertion of the circuit board 140 within the cavity 124 of the housing 120, the collar 170 will be slid from the first end 121 toward the second end 122 until the cut-outs 174 of the collar 170 abut against the inner side of the cavity adjacent the second end 122. Simultaneously, the cover 180 will be inserted within the second end 121 of the cavity 124 and the detentes 181 of the cover 180 will be compressed and in the finally mated position, the detentes 181 will expand up into hole 182 and lock the cover and printed circuit board within the cavity 124 of the housing 120. The thumb screws 190, 191 will also be inserted in the corresponding bores 192 of the housing. Therefore, it may be understood according to the above procedures, that a cable assembly may be quickly and easily assembled having a minimum of parts and providing for a terminated cable having a male connector for attachment of the cable to another device. In the preferred embodiment, this cable has been circuitized with terminator circuitry.

It may be understood that this cable assembly eliminated from prior art connectors an IDC connector where the cable is terminated and also eliminates an I/O connector at the opposite end. Such elimination of interconnects will allow control of impedance mismatch.

Turning to FIG. 5, a perspective view of the assembled cable assembly 110 is shown having the printed circuit board 140 mounted within the cavity of the housing 120 having the first end 142 of the printed circuit board having the beam 160 having conductive fingers 165 thereon protruding from the end of the housing 120 and surrounded by the shroud 130. The electrical cable 114 is inserted through the cover 180 and the cover is attached at the second end of the housing 120.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A cable assembly comprising:
   an electrical cable including a stripped portion exposing a plurality of conductors;
   a circuit board having a first end with a first plurality of conductive fingers oriented correspondingly to the conductors and the first end mounted to the electrical cable at the stripped portion wherein the plurality of conductors form a one-to-one electrical connection with the first plurality of conductive fingers and the circuit board having a second end having a second plurality of conductive fingers oriented thereon; and
   a housing having a first side and a second side and a cavity communicating between the first side and the second side and the second end of the circuit board protruding therefrom in order to provide a male I/O connector.

2. The cable assembly of claim 1 wherein the first and second pluralities of conductive fingers are adhered along the first end and the second end of the circuit board, respectively.

3. The cable assembly of claim 1 wherein the circuit board has a variation in thickness of 0.001 inch or less.

4. The cable assembly of claim 1 wherein the first plurality of conductive fingers is adhered along the first end of the circuit board.

5. The cable assembly of claim 1 wherein the first and second pluralities of conductive fingers are disposed with 0.8 mm spacing intervals.

6. The cable assembly of claim 1 wherein the housing includes a shroud having a D-shape.

7. The cable assembly of claim 1 wherein the circuit board has a collar mounted around the second end of the circuit board and a cover attached to the first end of the circuit board.

8. The cable assembly of claim 7 wherein the collar electrically insulates the circuit board.

9. The cable assembly of claim 1 wherein thumb screws are mounted within the housing.

10. The cable assembly of claim 1 wherein the circuit board is formed of glass-filled epoxy.

11. The cable assembly of claim 1 wherein the circuit board is formed of a molded polymer material.

12. The cable assembly of claim 1 wherein the housing is formed of a polymer material.

13. The cable assembly of claim 1 wherein the housing has a metallized coating to provide for EMI/RFI shielding.

14. The cable assembly of claim 1 wherein the cavity includes an insertion channel along a side of the cavity to provide for polarizing of the cavity and to aid insertion of the circuit board within the cavity.

15. The cable assembly of claim 1 wherein the electrical cable is a round insulated cable.

16. The cable assembly of claim 1 wherein the electrical cable is a flat cable.

17. The cable assembly of claim 1 wherein the circuit board includes a resistor network to provide for termination of signal lines of the electrical cable.

18. The cable assembly of claim 1 wherein the first plurality of conductive fingers is oriented along a first edge of the circuit board and each conductive finger within said first plurality of conductive fingers is soldered to a correspondingly oriented one of said conductors of the electrical cable.

19. The cable assembly of claim 1 wherein the first plurality of conductive fingers is oriented along a first edge of the circuit board and each conductive finger within said first plurality of conductive fingers is sonically welded to a correspondingly oriented one of said conductors of the electrical cable.

20. The cable assembly of claim 1 wherein the first and second pluralities of conductive fingers are formed of a copper material and have a protective gold layer.

* * * * *